(12) United States Patent
Waller

(10) Patent No.: US 6,944,305 B2
(45) Date of Patent: Sep. 13, 2005

(54) AUDIO DYNAMICS PROCESSING CONTROL SYSTEM

(76) Inventor: James K Waller, 9901 Allen Rd., Clarkston, MI (US) 48348

( * ) Notice: Subject to any disclaimer, the term of this patent is extended or adjusted under 35 U.S.C. 154(b) by 763 days.

(21) Appl. No.: 09/840,245

(22) Filed: Apr. 23, 2001

(65) Prior Publication Data

US 2002/0154786 A1 Oct. 24, 2002

(51) Int. Cl.[7] .................................................. H03G 3/00
(52) U.S. Cl. ....................................... 381/104; 381/107
(58) Field of Search ................................ 381/104, 107, 381/109, 106, 108

(56) References Cited

U.S. PATENT DOCUMENTS 5,263,091 A * 11/1993 Waller, Jr. .................. 381/106
5,794,187 A * 8/1998 Franklin et al. ............ 381/316

* cited by examiner

*Primary Examiner*—Stella Woo
(74) *Attorney, Agent, or Firm*—Frank J. Catalano

(57) ABSTRACT

An improved dynamics processing control system clamps a level detected control signal at a level equal to a predefined threshold point. In one embodiment, a clamped level detected signal feeds a filter with very slow response characteristics. By comparing the difference between the input and the output of the system a differential control signal generated. The differential control signal is used to provide a continuously variable, program dependant output signal when the input signal drops below a threshold point. In another embodiment of the invention, both the attack and release times of the system are varied in response to a differential control signal.

2 Claims, 5 Drawing Sheets

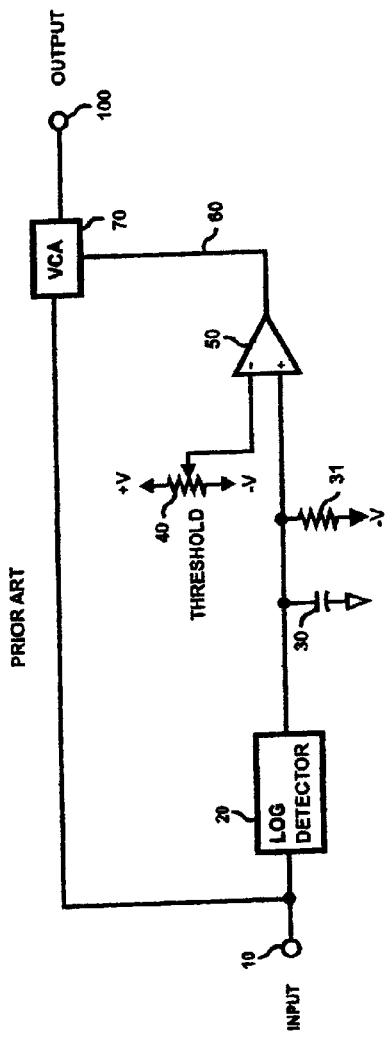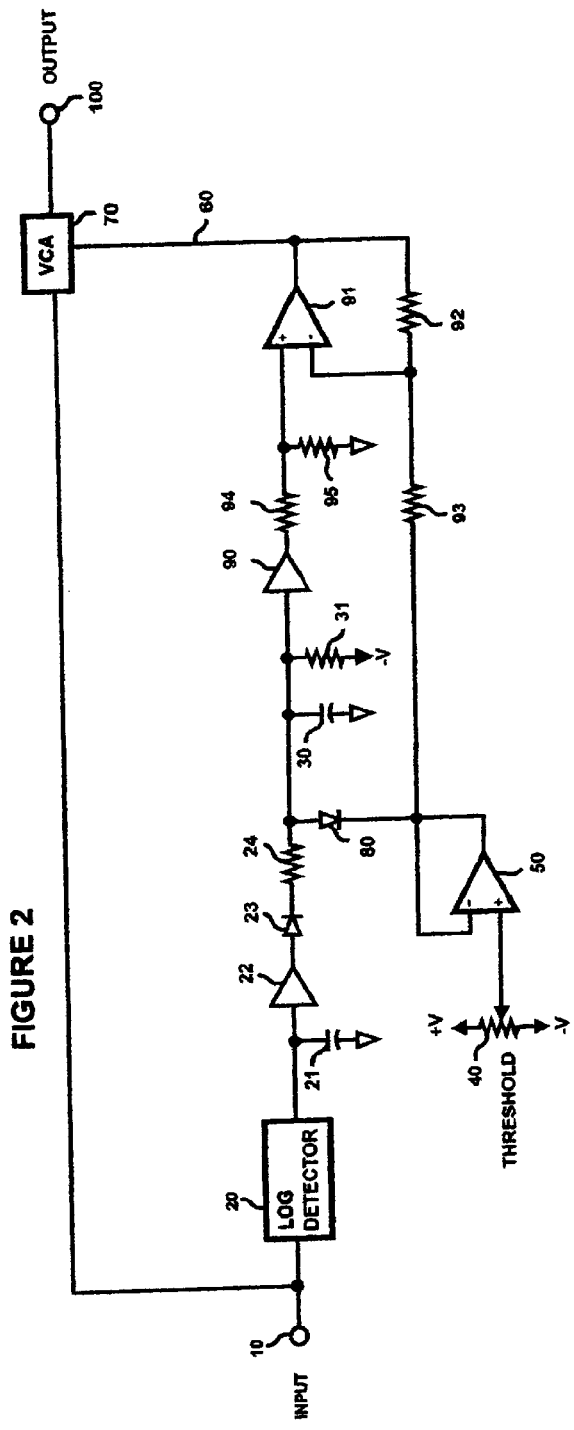

AUDIO DYNAMICS PROCESSING CONTROL SYSTEM

BACKGROUND OF THE INVENTION

The present invention relates generally to audio dynamics processors such as compressor expanders, limiters, noise reduction systems and more particularly concerns audio processors where the level or amplitude of an audio signal is dynamically altered in response to a generated voltage control signal. In particular the performance of downward expander type noise reduction systems designed for use with musical instruments will greatly benefit from this invention, however all dynamics processors may see improved performance by use of the present invention. All dynamics processors where a VCA (voltage controlled amplifier) or VCF (voltage controlled filter) is used to modify the amplitude or frequency of an audio signal in response to a DC control signal may see the above mentioned improved performance and transparency by use of this improved dynamics processing control system. As will be apparent to the skilled artisan the improvements of the invention can also be applied to all dynamics processors. One of the major benefits of the invention will be fully explained in conjunction with below threshold, downward expanders. The attack time of a dynamics processor can also see major benefit from various embodiments of the current invention. For example a compressor with fully program dependent attack and release time can be realized by use of the current invention. My current pending surround system patent application can also be further improved by use of the teachings contained herein. Surround systems, such as the one disclosed in my pending application, use numerous audio level detectors and generate control signals in response to a stereo input signal. By applying the continuously variable attack and release improvements disclosed in this application the subjective transparency of a surround system can be greatly improved. Below threshold, expander type noise gates have been commonly know and used for noise reduction in professional recording applications for many years. One of the most successful noise reduction systems for use with musical instruments, such as guitar, bass and keyboards, is a system commercially known as the "HUSH" noise reduction system. The HUSH noise reduction system uses a combination of low-level downward expansion and dynamically controlled low-pass filtering. The operation of the dynamically controlled low-pass filter portion of the HUSH is disclosed in my previous U.S. Pat. No. 4,696,044. When the HUSH system is used to provide noise reduction for instruments such as guitar, the downward expander provides the most important and most audible aspect of the performance of the system. Conversely, when using the HUSH noise reduction system with composite music, the dynamic filters provide the most critical aspect of the operation of the system. One of the most difficult applications for noise reduction is the removal, or suppression of the noise that is present in high gain guitar systems. My U.S. Pat. No. 4,881,047 discloses a noise reduction system specifically designed to suppress the gain noise of a high-gain distortion circuit. The system disclosed in the 047 patent will also greatly reduce the amount of audible hum present in a high-gain guitar distortion system by reducing the gain of the preamplifier distortion circuit. While the above disclosed systems and many of the previously available expander noise reduction systems have provided improvements in audio performance, they fall short of achieving optimal performance under all conditions. The prior art below threshold expander systems typically provide a preset or in some cases a user adjustable fixed slope release characteristic. In order to avoid audible distortion of the input signal or serious pumping side effects it is desirable to have a slow release time constant for the control signal. As is commonly know in the art, when using a very fast time constant for the control voltage, excessive ripple in the control signal will modulate the VCA of a dynamics processor thereby causing audible distortion, pumping or breathing. If the input signal contains low frequency components a fast time constant can cause modulation of each cycle of the audio signal, thereby causing undesirable and in some case very audible distortion. While slowing the release time of an expander will improve the above mentioned side effects a slow release time will also allow the noise floor to momentarily become audible when the input signal stops suddenly. This causes another objectionable side effect in the expander performance. Making the release time dynamically variable as described in my U.S. Pat. No. 4,881,047 can offer improvements in expander performance. While this is an improvement over typical below threshold expanders further improvements can be made by generating a more accurate, responsive and or continuously variable control signal. As described in the 047 patent, there is desire to have a control signal that will have a slow release time when the instrument signal has a long sustained decay and also provide a very fast release time when the musician is playing staccato, or abrupt notes. While the teachings of the 047 patent are an improvement over the prior art, further improvements in performance can be made by clamping the control signal so that the release time begins at a predefined voltage level, typically at a point equal to the expander threshold. Audio expanders typically use some form of level detection that converts the input audio signal to a DC control signal. The generated control signal typically has a predefined release time constant characteristic. When the input level drops below a user adjustable threshold point downward expansion will begin. The amount of expansion will increase as the input signal continues to drop further below the threshold point. In the prior art systems, the detection circuit will charge a timing capacitor well in excess of the predefined threshold point. The result is that when the input signal stops abruptly the prior art expander does not provide any reduction of the input signal until the timing capacitor voltage drops below the preset threshold point. This results in a "dead zone" where the control signal is decreasing but has no affect on the operation of the downward expander. While the teachings of the 047 patent show one way to improve this problem this design also suffers as a result of having a dead zone in the release response.

It is, therefore, a major object of the present invention to provide an improved audio dynamics processing control signal, for use in below threshold applications, that will eliminate this above described "dead zone" and allow the control signal to be immediately responsive to the input signal when it drops below the threshold point. Most of the prior art systems have a predefined or user adjustable release response. In the 047 patent an improved method of changing the release response time by switching to a fast time constant when the input signal drops rapidly is disclosed. While the teachings of the 047 patent are an improvement over the prior art, further improvements are possible by making the release time continuously variable and totally responsive to the envelope of the input signal. It is, therefore, a further objective of the present invention to offer a continuously variable release response that has a very slow release for long sustained signals and continuously varies the release slope to track the envelope of the input signal for more rapidly decaying signals. It is a further object of the present invention to provide a very fast release time when the input signal decays quickly or stops abruptly. Yet another objective of the present invention is to provide an improved audio dynamics processing control signal where both the attack and release time period is totally responsive to the short term envelope of the input signal and yet eliminates the audible side effects of the prior art systems.

SUMMARY OF THE INVENTION

In accordance with the invention, an improved audio dynamics processing control system is provided where the input signal is first processed by an audio level detector, preferably a logarithmic audio level detector that provides the absolute value of the logarithm of the input signal. A filter having a very fast time constant smooths the output of the level detector. In the simplest embodiment for expander applications, the level detector output is clamped at a predefined threshold point and thus provides an immediately responsive control signal when the input signal drops below the threshold. In another embodiment the clamped, level detected signal feeds a second filter with a very long release time. A differential amplifier compares the difference between the fast time constant of the level detected signal and the slow time constant of the second filter and generates a differential time constant control signal. When there is a large difference between the level detected output voltage and the second filter output voltage the difference amplifier will provide a proportionately large output voltage. This will generate a differential time constant control signal. The differential time constant control signal is applied to a current source that is used to vary the release time constant of the second filter. As the second filter output voltage becomes closer to that of the level detected output voltage the output of the differential amplifier will decrease, thereby slowing the rate of change in the second filter output. When the second filter output voltage matches the voltage of the level detector output, the second filter time constant reverts back to a slow smooth response. The final audio dynamics processor control voltage is present at the output of the second filter.

In yet another embodiment of the invention, an improved audio dynamics processor control system providing continuously variable, program dependent attack and release response, is disclosed. Both the attack and release time constants are dynamically varied by use of two symmetrical current sources in response to a differential time constant control signal. When the differential control signal increases in one direction one current source varies the attack time. The release time remains slow until there is a large drop in the input signal. When the input signal decreases, the output of the differential amplifier produces an opposite and increasing control signal that is applied to a second current source to vary the release response of the output control signal.

BRIEF DESCRIPTION OF THE DRAWINGS

Other objects and advantages of the invention will become apparent upon reading the following detailed description and upon reference to the drawing in which:

FIG. 1 is a block diagram of the prior art;

FIG. 2 is an example of a clamped threshold control signal embodiment of the invention;

DETAILED DESCRIPTION

Figure 3:
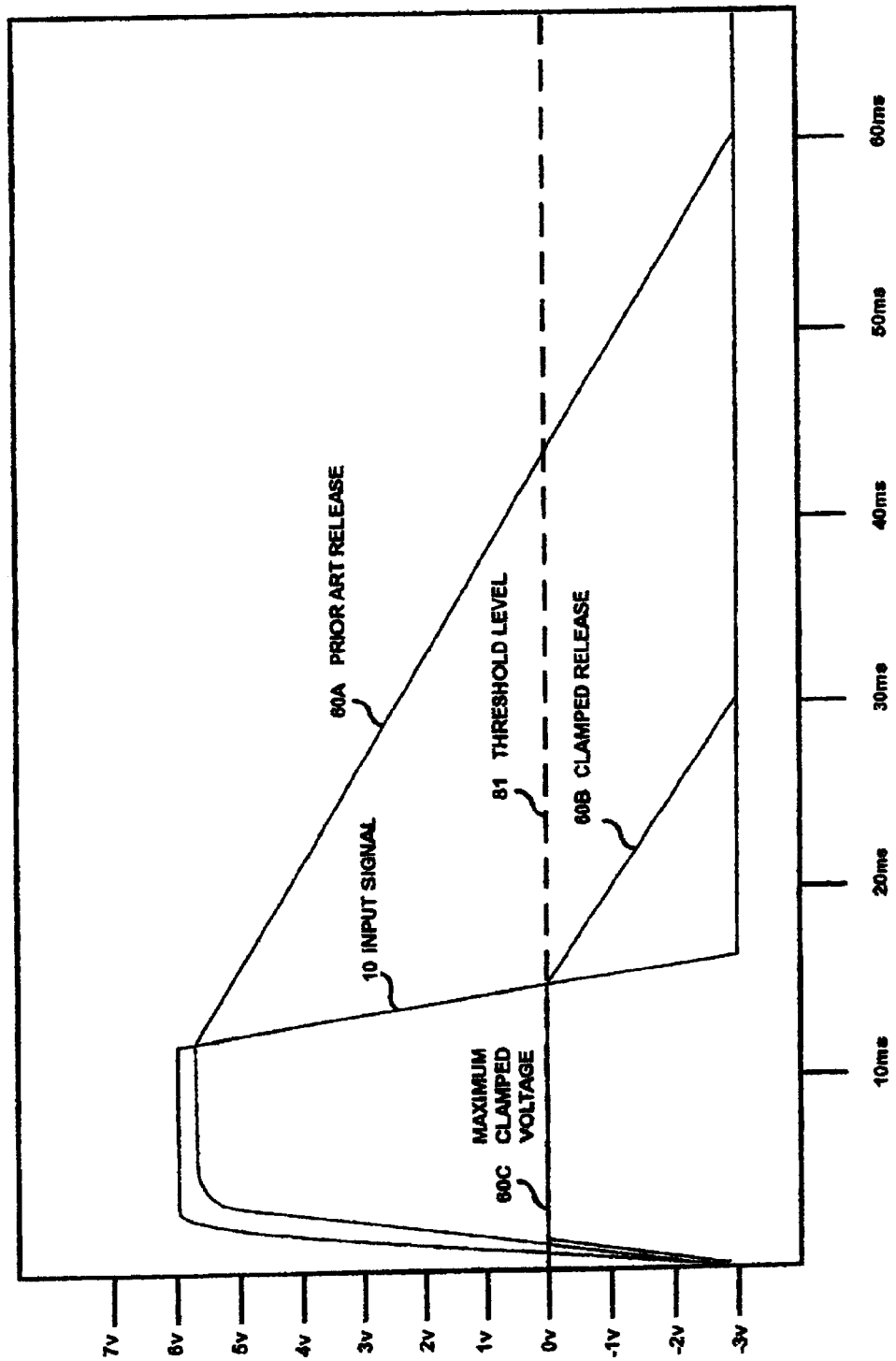
FIG. 3 is a graphical representation of the release response of the prior art and the release response of the clamped threshold embodiment of the current invention.

Referring to FIG. 1, a typical prior art dynamics processor is shown. In the configuration shown, the prior art dynamics processor will operate as a downward expander. The input audio signal is applied to the system input at 10. The input signal at 10 is fed to both the input of a logarithmic based level detector 20 and the input of Voltage Controlled Amplifier (VCA) 70. The output of log detector 20 is filtered and smoothed by capacitor 30. The output of log detector 20 is also connected to timing resistor 31 and the positive input of operational amplifier 50. The negative input of amplifier 50 is connected to variable resistor 40. The skilled artisan will understand that op-amp 50 requires negative feedback for proper operation, this required feedback resistor has been omitted to simplify the prior art drawing. The output of operational amplifier 50 provides a voltage control signal 60 that is applied to the control port of VCA 70. In operation the output of log based level detector 20 is filtered by capacitor 30 to provide a smoothed DC control signal. The value of capacitor 30 will determine the attack time of the system. The release time period is determined by both the value of capacitor 30 and resistor 31. In some systems a user variable release time is achieved by changing the value of resistor 31. Operational amplifier 50 amplifies the generated DC control signal to a volt per decibel level required to feed VCA 70. In the prior art system the control port of VCA 70 will only produce a gain change when the control signal 60 drops below 0 volts. When the control signal is positive, above 0 volts, VCA 70 will provide a gain of 1. When the control signal 60 drops below 0 volts the gain of VCA 70 will decrease providing downward expansion. As the control signal decreases below 0 volts, downward expansion increases thereby reducing the audio output level of the system at 100. Variable resistor 40 adjusts the output DC level of op-amp 50; this provides a user adjustable threshold level for the expander. By using a log based level detector the output control signal at 60 will be linear in volts per decibel. VCA 70 will also typically provide a response that is linear in volts per decibel. By changing the gain of operational amplifier 50 the ratio of the system can also be changed.

Referring to FIG. 2, a clamped detection control signal embodiment of the invention is shown. Similar numbers are used in the drawings to indicate like functions. The input signal 10 is applied to both the input of log based level detector 20 and the input of VCA 70. Other types of level detection can be used, such as peak or averaging, but with degraded system performance. The output of log detector 20 provides an output equal to the absolute value of the logarithm of the input signal. The output of detector 20 feeds filter capacitor 21 and the input of buffer amplifier 22. Capacitor 21 is a relatively small value capacitor, on the order of 0.001 microfarad. The output of buffer amplifier 22 connects to the anode side of diode 23. The cathode side of diode 23 connects to one end of resistor 24. The other end of resistor 24 connects to timing capacitor 30, the anode side of clamping diode 80, timing resistor 31, and the input of buffer amplifier 90. The other side of capacitor 30 is connected to ground. The other end of resistor 31 is connected to the negative supply voltage. The cathode side of diode 80 is connected to the output of buffer amplifier 50. The positive input of buffer amplifier 50 is connected to variable resistor 40, which determines the threshold level of the system. The output of buffer amplifier 50 also feeds resistor 93, which is connected to the negative input of differential amplifier 91. The output of buffer 90 connects to resistor 94, which is connected to the positive input of op-amp 91. The positive input of difference amplifier 91 is also connected to resistor 95, which connects to ground. Feedback resistor 92 is connected between the output and negative input of differential amplifier 91. The final control signal 60 appears at the output of amplifier 91. Control signal 60 is applied to the control port of VCA 70 to control the gain of the system. The final audio output appears at the system output 100. In operation, when there is an input signal present at 10, with an increasing signal level, the output of buffer amplifier 22 will produce an increasing output voltage. Capacitor 21 filters the voltage spikes present at the output of log detector 20 and has little effect on the timing of the final control signal. Capacitor 21 could be omitted with little sacrifice in overall system performance. The filtered output is connected to the input of buffer amplifier 22, which provides a low output impedance required to drive the control signal timing circuit. A positive going voltage at the output of buffer 22 will pass through diode 23 and charge capacitor 30 through resistor 24. The attack time of the system will be determined by the value of resistor 24 and capacitor 30. The use of diode 23 ensures that the only discharge path for capacitor 30 is through resistor 31. The increasing voltage at the anode side of diode 80 will be clamped at the voltage level present at the output of buffer amplifier 50 plus one diode drop. The clamp level will change with the setting of threshold control 40. The threshold control 40, of the system determines where downward expansion begins. Since capacitor 21 has virtually no affect on the release time of the system, the release time period will begin immediately when the input signal level drops below the clamped threshold point set by variable resistor 40. Resistors 92, 93, 94, and 95 will all be the same value typically 20 k ohms. The gain of difference amplifier 91 will be 1 for both positive and negative input signals thus allowing the buffered output of signal 90 to pass at unity gain. When the threshold level 40 is changed a proportional change in output voltage will be reflected in the output of difference amp 91. The net result is that the clamped level will produce the exact same clamped output voltage at the output of difference amp 91 at all threshold settings. This will be typically set to 0 volts DC which will conveniently interface with the control port of VCA 70.

Referring now to FIG. 3, the full advantages of the clamped threshold embodiment of the current invention will be fully explained. FIG. 3; show a graphical representation of the timing signal of both the prior art and the current invention. The input signal 10 is shown to represents a typical output voltage of log based level detector 20 in both figures one and two. The input signal 10 is purely illustrative and represents an input signal from an instrument, such as a guitar, with a single short staccato note. It will be apparent to the skilled artisan that the voltage at the output of level detector 20 is typically on the order of 3 mv to 6 mv per decibel. In many designs, the output of the level detector is amplified to a much greater volt per decibel level such as that shown. It should also be understood that the voltage levels shown are strictly illustrative and much lower voltage outputs can also be applied in consumer systems. The skilled artisan will also know how to vary the volt per decibel response at the input of the VCA control port to allow the system to operate at any desirable volt per decibel reference. As stated above, the input signal 10 is shown to represent the typical output signal from log detector 20 in FIGS. 1 and 2. Plot 60A shows the typical prior art signal at control signal output 60. Dotted line 81 represents a system threshold setting at 0 volts. In the prior art system it can be seen that the control voltage available to charge timing capacitor 30 in FIG. 1, will greatly exceed the threshold level set at 0 volts. Line 60A shows that as the input signal becomes very high the output of log detector 20 will cause the timing capacitor 30 to charge well above the preset threshold level of 0 volts. When the input signal stops abruptly, as is illustrated in FIG. 3, the stored voltage in capacitor 30 must discharge for approximately 30 ms before any change in the gain of VCA 70 begins. The result is a dead zone in the response of the downward expander during the time that the timing capacitor is discharging down to the set threshold. If this time period is long, on the order of 30 ms or greater, the background noise remains unmasked for an excessive period of time causing pumping or breathing depending on the spectrum of the background noise. The typical approach to solve this side effect is to increase the release time of the system. While this can help reduce the above mentioned side effect, it will also increase the modulation of a the audio signal causing an audible distortion of the audio signal when a long sustained, or slowly decaying input signal is present. This audible modulation distortion is very noticeable as a choppy sounding or grainy, unnatural sound. This distortion side effect is equally as objectionable as the abovementioned problem of pumping and breathing. Referring again to FIG. 3, 60C shows the result of clamping the maximum charging voltage at the set threshold level. The voltage on capacitor 30 is clamped at 0 volts and cannot exceed the preset threshold level. Line 60B represents the release response of the embodiment of the invention shown is FIG. 2. It can be seen that by clamping the maximum charging voltage of timing capacitor 30 at the threshold point, the release of the system will immediately start when the input signal drops below the threshold point. This eliminates the dead zone in the release response and also allows a slower release time to be used before any audible pumping or breathing becomes audible. Due to the fact that a longer release time can be used, the system typically will also avoid any audible modulation distortion with a long decaying input signal. As previously explained, with respect to FIG. 2, changing the threshold setting will maintain the maximum charging voltage exactly at the same point as the user set or predefined threshold point. While this embodiment of the invention provides a major improvement over the prior art for many applications, implementing a differentially controlled embodiment of the invention can see even greater performance improvements.

Figure 4:
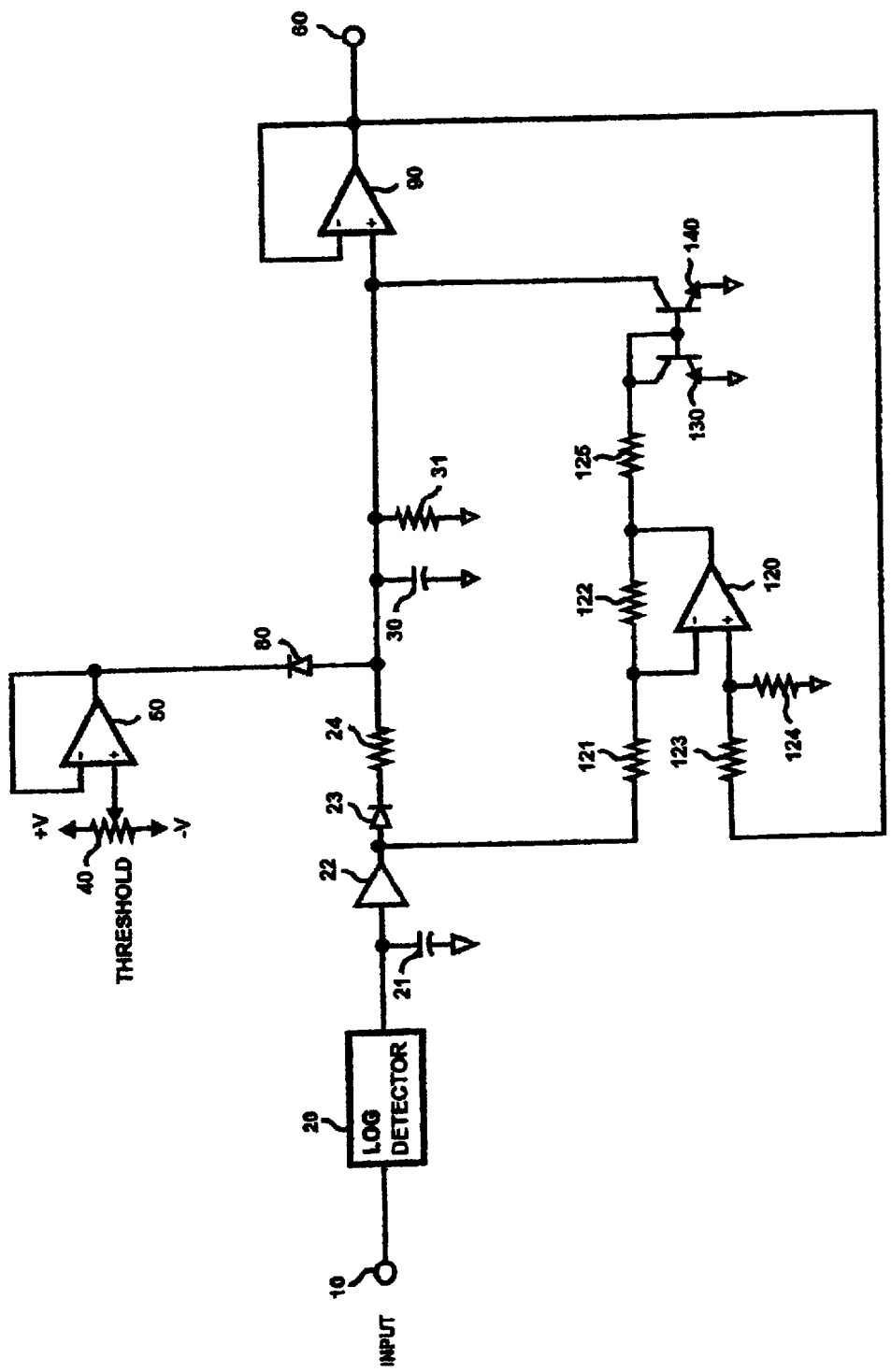
FIG. 4 is an example of a differentially controlled, continuously variable embodiment of the invention.

Referring now to FIG. 4, an example of a differentially controlled, continuously variable embodiment of the invention will be described. As in the previous drawings, like numbers are used to show identical functions. The audio signal is fed to the input 10, which feeds the input of log detection circuit 20. The output of log detector 20 is filtered by capacitor 21 and buffered by buffer amplifier 22. The output of buffer amplifier 22 provides a low output impedance to drive the remaining circuitry. The output of buffer 22 feeds the anode side of diode 23 and one end of resistor 121. The cathode side of diode 23 is connected to resistor 24 the other end of resistor 24 connects to capacitor 30. These two components, as previously described, determine the attack time of the system. This node of the circuit is also connected to clamping diode 80, resistor 31, the positive input of buffer connected operational amplifier 90 and the collector of NPN transistor 140. The output of buffer 90 provides the final control signal output at 60. Depending on the desired application, additional circuitry may follow the output of buffer 90 as was disclosed in FIG. 2. It will be apparent to the skilled artisan that there are numerous modifications that can shift the final output operating voltage, or if desired the teachings of FIG. 2 can be applied by adding difference amplifier 91 as shown in FIG. 2. Continuing now with reference to FIG. 4, a typical value for capacitor 30 and resistor 31 may be 0.1 uf and 1 meg ohm respectfully. The value of capacitor 21 in FIG. 4 will be larger than that described in FIG. 2, but will still provide an output at buffer amplifier 22 which will have a fast attack and release response. This will allow the output of buffer amplifier 22 to follow the short-term dynamic changes of the input signal thus providing very fast attack and release. The above stated values for capacitor 30 and resistor 31 will provide a very large time constant. This means that the output of buffer amplifier 90 will have a very slow release. The output of buffer amplifier 90 provides output signal 60 and also feeds the positive input of differential amplifier 120 via resistor 123. Resistors 121, 122, 123, and 124 are all typically 20 k ohms thus providing a unity gain differential amplifier. The output of differential amplifier 120 feeds one end of resistor 125. The other end of resistor 125 connects to diode-connected transistor 130. The cathode side of transistor 130 is tied to ground. The common tied base and collector of transistor 130 connects to the base of transistor 140 the emitter of transistor 140 is also connected to circuit ground. The collector of transistor 140 is connected to the previously mentioned common connection that feeds the positive input of buffer 90. The cathode end of diode 80 is connected to the output of threshold buffer amplifier 50. Transistors 130 and 140 form a current mirror that will vary the release time of the system. In operation, differential amplifier 120 compares the difference between the output voltage at buffer output 22 and the output voltage at buffer amplifier 90. When the output of buffer 90 is positive with respect to the output of buffer 22 a positive differential control signal will present at the output of difference amplifier 120. Current source 140 will only sink current, thereby increasing the release time of the system, when there is a positive differential control signal present at the output of difference amp 120. The output of diff amp 120 must be positive by more than 0.6 volts before any current flows into current mirror transistors 130 and 140. When a large input signal applied to input 10 the output of buffer amplifier 22 will produce a positive output voltage. Since the attack time at the output of buffer amplifier is considerably faster than the attack time that will be seen at the output of buffer 90, the voltage at the output of buffer 22 will be more positive than the output of amplifier 90. Capacitor 30 will charge up to a voltage equal to the predefined clamp point determined by threshold circuit 40, 50 and 80. Under this condition the output of difference amplifier 120 will be negative with respect to circuit ground. When the output of difference amp 120 is negative, there will be no current flowing into diode connected transistor 130, therefore, there will be no collector current flowing into current source 140. When the input signal drops, the output voltage at buffer amplifier 90 will exceed the output voltage of buffer amp 22. This means that the output of difference amplifier 120 will become positive creating a positive differential control signal, which will cause current to flow into current mirror 130 and 140. Resistor 125 is a relatively large value typically 3.3 Meg ohms. The voltage across resistor 125 will provide an input current to feed current mirror transistors 130 and 140. This will cause current source transistor 140 to sink current. This will result in an increase the release time of the system. If the input signal stops very abruptly, as would be the case with an input from a guitar playing staccato notes, the differential control signal at the output of differential amplifier 120 will become quite large. This will cause a proportionately large current to flow into transistor 140; as a result the release time of the system will be very fast. With a moderately slow decaying input signal present at the input, the differential control signal at the output of diff amp 120 will be considerately smaller. This will produce a much smaller current to flow into transistor 140 and the release time of the system will be relatively slow. If the input signal is a very long sustained signal with an extremely slow decay time the differential control signal at the output of diff amp 120 will be zero volts and the release time of the system will be affected only by the value of capacitor 30 and resistor 31. It becomes apparent that the system will provide a continuously variable release time based on the characteristics of the envelope of the input signal. With a low frequency input signal the system the ripple at the output of buffer amp 22 will be very large. This will produce a sinusoidal like differential output control signal thus producing a current flow into current source 140 only on the positive portion of the differential control signal. The result is that the ripple at the output 60 of the system will be only a fraction of that at the output of buffer 22. This will cause only a slight modulation of the gain of the VCA controlling the dynamics of the final output. This allows the system to be totally responsive to the dynamics of the input signal and yet avoid modulation distortion that would typically result with systems capable correspondingly fast release times.

Figure 5:
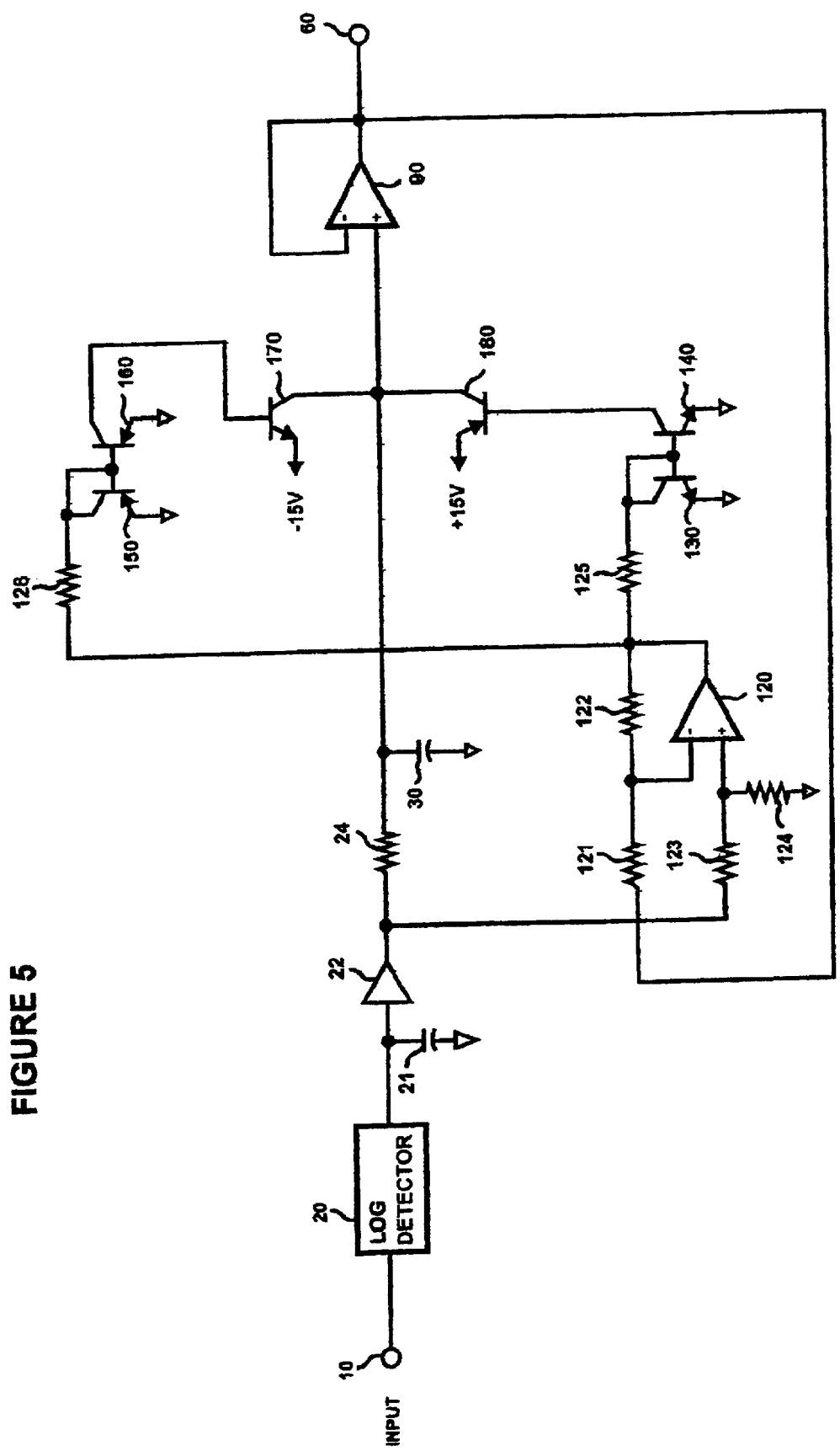
FIG. 5 is an example of a symmetrical, differentially controlled, continuously variable attack and release embodiment of the invention.

Referring now to FIG. 5, an example of a symmetrical, differentially controlled, continuously variable attack and release embodiment of the invention will be described. FIG. 5 closely resembles the system disclosed in FIG. 4 with the addition of a second current mirror provided by transistors 150 and 160 and additional current sources 170 and 180. The positive input of differential amplifier 120 is connected to the output of buffer amplifier 22 and the negative input is connected to the output of buffer 90. The components with identical reference designations in FIG. 5 to that of FIG. 4 perform identical operations and functions, therefore, the description of FIG. 5 will deal specifically with the additional components and operation on the enhanced embodiment. If the output of differential amplifier 120 is zero volts, the attack and release time of the system be predominately determined by resistor 24 and capacitor 30. PNP transistors 150 and 160 form a current mirror that will source current when the output of differential amplifier 120 is negative by more than 0.6 volts. PNP transistor 150 has the base and collector connected together and is also connected to the base of PNP transistor 160. The emitters of both transistors 150 and 160 are connected to circuit ground. The output of diff amp 120 connects to resistor 126, which provides the programming current for the input of current mirror transistors 150 and 160. The collector current of transistor 160 sources base current to transistor 170. The emitter of transistor 170 is connected to the negative power supply of the system. As described above, the inputs of differential amplifier 120 are flipped from that of FIG. 4 thus producing a positive output at differential amplifier 120 when the output of buffer amplifier 22 is positive with respect to buffer amplifier 90. When the input signal has a very rapid increase in level, the output of buffer 22 will rise rapidly when compared to buffer 90. This will create a positive differential control signal at the output of differential amplifier 120. This positive voltage will cause a current to flow into mirror transistor 130 thereby producing a proportional current to flow into the collector of transistor 140. This will in turn cause current source transistor 180 to source current to charge capacitor 30. The result is that the attack time of the system will vary proportionally in relation to the positive output voltage level of differential amplifier 120. When the output of differential amplifier 120 goes negative, the opposite current mirror, comprised of transistors 150 and 160, becomes active and the release time of the system is varied. The input current to mirror transistor 150 is mirrored at the collector of transistor 160. This sources current to the base of transistor 170 which in turn will cause collector current to flow into the base of current source transistor 170. The emitter of transistor 170 is connected to the negative supply of the system. The base current of transistor 170 will cause current to flow into the collector of transistor 170. This will vary the release time of the system. It becomes apparent that both the attack and release time of the system will change in relation to the positive and negative output voltage of differential amplifier 120 respectively. The system will start to vary the attack and release time when differential output control signal exceeds 0.6 volts positive or negative. The skilled artisan will recognize numerous way to reduce this 0.6 volt operating point if it is desirable to have the system avoid the plus and minus 0.6 volt operating window. For example, the ground reference voltage where the emitters of transistors 130 and 140 are connected can be changed to a negative 0.6-volt reference voltage thereby allowing the attack time of the system to be immediately responsive to the differential control signal. The advantages of the embodiment of invention shown in FIG. 5 can be to be applied to applications such as compression where it may be desirable to dynamically change both the attack and release time in response to the envelope of the input signal.

Figure 6:
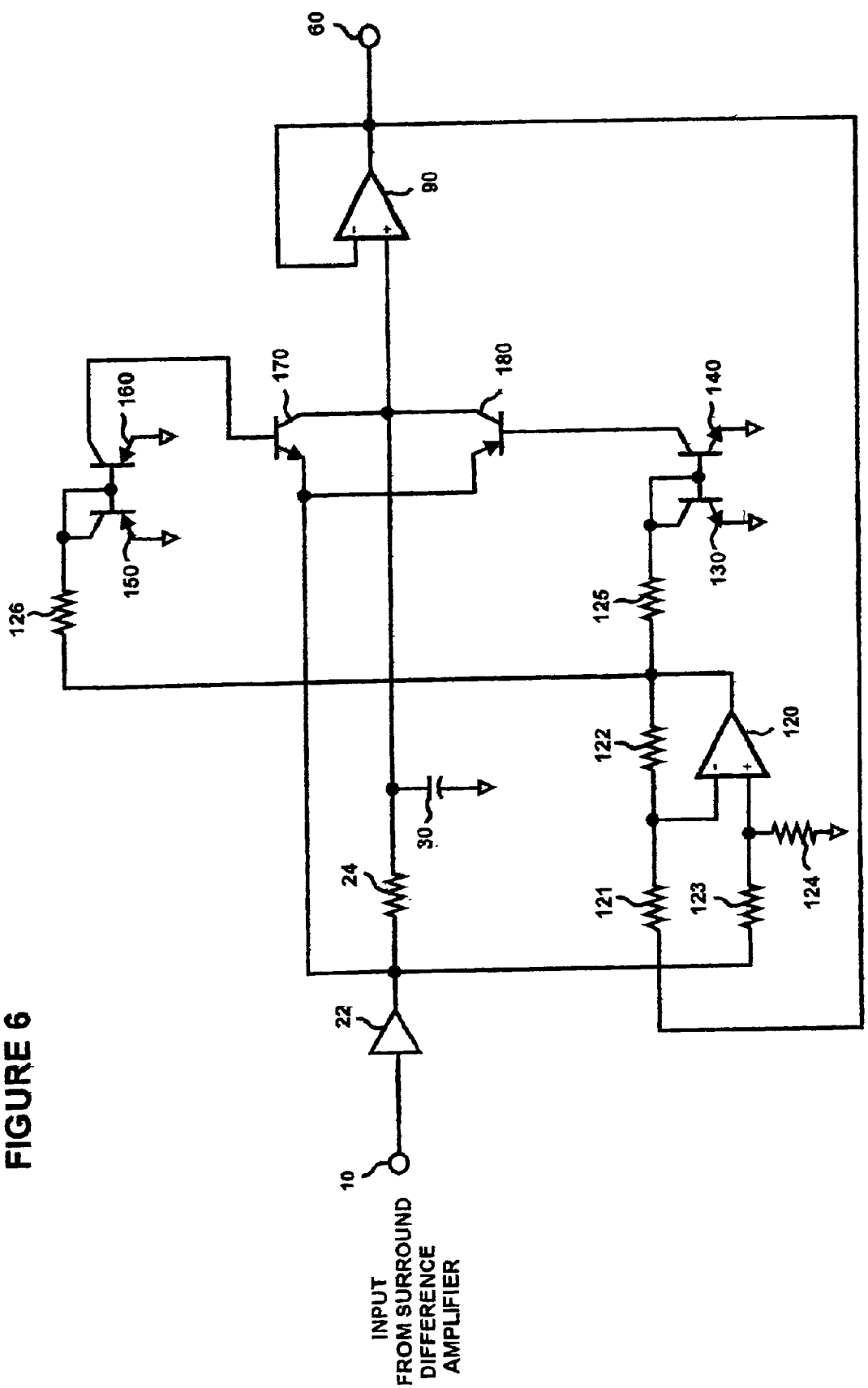
FIG. 6 is an example of the symmetrical, differentially controlled, continuously variable embodiment of the invention modified for surround steering applications.

The advantages of the invention can also be applied to controlling surround systems such as the one disclosed in my pending patent application titled "DYNAMIC SPECTRAL MATRIX SURROUND SYSTEM". In a surround system it is desirable to provide fast response time for quickly changing directional signals while avoiding noticeable image wandering or distortion of the audio signal as a result of a fast release time in the system. The present invention can be applied to surround matrix steering systems providing a major improvement over previous methods of controlling the steering response time. Referring now to FIG. 6, an example of the symmetrical, differentially controlled, continuously variable embodiment of the invention, modified for surround steering applications will be described. FIG. 6 is the same as FIG. 5 with the following modifications. The emitters of current source transistors 170 and 180 are connected together and also connect to the output of buffer amplifier 22 and log detector 20 and filter capacitor 21 are also omitted. The steering control for a surround matrix system, such as the one disclosed in my pending application generates a difference signal based on the dominance of either the left and right input signals or the difference of the L+R and L−R signals. Referring again to FIG. 6, one of the above mentioned difference signals from a surround system is applied to the input 10 and is buffered by buffer amplifier 22. The input signal will typically have undergone some filtering of the level detected signals but will have a very fast response to the changes in directional dominance. As was explained with respect to FIG. 5, a differential control signal is generated by difference amplifier 120, which controls both the charging and discharging of capacitor 30. When no differential control signal is present at the output of amplifier 120 the system response time will be defined by resistor 24 and capacitor 30, typically 1 meg ohm and 0.1 uf respectively. When there is positive input signal applied to input 10, a positive differential control signal will be generated at the output of amplifier 120. As was described with respect to FIG. 5 current mirror transistor 140 will source base current to transistor 180 thereby increasing the charging time of capacitor 30. The emitter of transistor 180 is connected to the output of buffer amplifier 22 and therefore provides an enhanced charging path is from the output of buffer amplifier 120 through transistor 180 to increase the charging time of capacitor 30. It is desirable to have a fast response time for quick changes in directional dominance and the system will provide for very fast charging of timing capacitor 30. The only discharge path for capacitor 30 is back through resistor 24 which will provide a very slow discharge time. Since the current mirror transistors 150 and 160 are referenced to circuit ground, the second symmetrical current mirror transistors 150 and 160 and current source transistor 170 cannot provide sink current to discharge capacitor 30 until the output of buffer amplifier 22 goes negative with respect to ground. This means that the system will provide a very fast attack time in either direction with a very slow release. Only if the input signal contains an actual change in directional dominance will the release time of the system accelerate due to the change of polarity of the input signal. This improvement allows a surround steering system to provide a fast attack time, for steering the surround matrix, with a slow smooth release in one direction. Only when the input signal contains a change in directional dominance, i.e. there is a change in the polarity of the input signal, will the release time increase thus allowing the matrix to quickly steer to the new direction.

It is understood that all of the above disclosed aspects of the invention can also be realized by use of Digital Signal Processing techniques. Specific algorithms incorporating some or all aspects of the invention are clearly anticipated.

Thus, it is apparent that there has been provided, in accordance with the invention, an improved audio dynamics processing control system that fully satisfies the objects, aims and advantages set forth above. While the invention has been described in conjunction with specific embodiments thereof, it is evident that many alternatives, modifications and variations will be apparent to those skilled in the art and in light of

I claim:

1. For use in an audio dynamics processor, a process for generating a dc control signal from an input audio signal comprising the steps of:

deriving a level detected signal from the input signal providing a fast time constant;

providing a system threshold level;

clamping the level detected signal at a point equal to the system threshold level; and deriving from the clamped level detected signal a dc signal providing a long time constant.

2. For use in an audio dynamics processor, a process for generating a dc control signal from an input audio signal comprising the steps of:

deriving a level detected signal from the input signal providing a fast time constant;

providing a system threshold level;

clamping the level detected signal at a point equal to the system threshold level;

deriving from the clamped level detected signal a dc signal providing a long time constant;

generating a differential time constant control signal by differencing the level detected fast time constant and the dc signal providing a long time constant; and varying the long time constant in relation to the differential time constant control signal.

* * * * *